(12) United States Patent
Yang

(10) Patent No.: US 11,876,067 B2
(45) Date of Patent: Jan. 16, 2024

(54) SEMICONDUCTOR PACKAGE AND METHOD OF MANUFACTURING THE SAME

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 215 days.

(21) Appl. No.: 17/451,158

(22) Filed: Oct. 18, 2021

(65) Prior Publication Data

US 2023/0119348 A1 Apr. 20, 2023

(51) Int. Cl.
*H01L 23/00* (2006.01)
*H01L 25/065* (2023.01)

(52) U.S. Cl.
CPC .............. *H01L 24/49* (2013.01); *H01L 24/09* (2013.01); *H01L 24/20* (2013.01); *H01L 24/85* (2013.01); *H01L 25/0657* (2013.01); *H01L 2224/09515* (2013.01); *H01L 2224/4903* (2013.01); *H01L 2224/49111* (2013.01); *H01L 2225/0651* (2013.01); *H01L 2924/30107* (2013.01)

(58) Field of Classification Search
CPC ................ H01L 2224/49111; H01L 2224/023
See application file for complete search history.

(56) References Cited

U.S. PATENT DOCUMENTS

| | | | |
|---|---|---|---|
| 2012/0155049 A1* | 6/2012 | Haba | H01L 23/13 361/803 |
| 2013/0292834 A1 | 11/2013 | Haba et al. | |
| 2014/0027906 A1 | 1/2014 | Narita et al. | |

* cited by examiner

*Primary Examiner* — Yu-Hsi D Sun
(74) *Attorney, Agent, or Firm* — CKC & Partners Co., LLC

(57) ABSTRACT

A semiconductor package includes a package substrate, a semiconductor chip and a plurality of bonding wires. The package substrate includes a connection pad. The semiconductor chip is disposed over the package substrate and includes a chip pad, a bonding pad, and a redistribution layer. The bonding pad is closer to a periphery of the semiconductor chip than the chip pad. The redistribution layer is connected between the chip pad and the bonding pad. The bonding wires are connected in parallel between the connection pad and the bonding pad.

10 Claims, 2 Drawing Sheets

SEMICONDUCTOR PACKAGE AND METHOD OF MANUFACTURING THE SAME

BACKGROUND

Technical Field

The present disclosure relates to a semiconductor package and method of manufacturing the same.

Description of Related Art

In semiconductor packages, the usage of wirings, particularly longer wirings, could cause power supply issues (e.g., insufficient current) due to the inductive reactance of the wirings.

SUMMARY

In view of the foregoing, one of the objects of the present disclosure is to provide a semiconductor package that enables stable power delivery.

To achieve the objective stated above, in accordance with some embodiments of the present disclosure, a semiconductor package includes a package substrate, a first semiconductor chip and a plurality of first bonding wires. The package substrate includes a first connection pad. The first semiconductor chip is disposed over the package substrate and includes a first chip pad, a first bonding pad, and a first redistribution layer. The first bonding pad is closer to a periphery of the first semiconductor chip than the first chip pad. The first redistribution layer is connected between the first chip pad and the first bonding pad. The first bonding wires are connected in parallel between the first connection pad and the first bonding pad.

In one or more embodiments of the present disclosure, the first chip pad is a power pad or a ground pad through which power is supplied to the first semiconductor chip.

In one or more embodiments of the present disclosure, the first semiconductor chip further includes a second chip pad electrically connected to the package substrate through a second bonding wire. The second chip pad is a data signal pad or a command/address signal pad.

In one or more embodiments of the present disclosure, the first semiconductor chip further includes a second bonding pad and a second redistribution layer. The second redistribution layer is connected between the second chip pad and the second bonding pad. The package substrate further includes a second connection pad. The second bonding wire is connected between the second connection pad and the second bonding pad. The second bonding wire is the only conductive path between the second connection pad and the second bonding pad.

In one or more embodiments of the present disclosure, one or more of the first bonding wires have a cross-sectional area greater than a cross-sectional area of the second bonding wire.

In one or more embodiments of the present disclosure, the first bonding wires include a first wire and a second wire. The first wire and a second wire each have a first end and a second end. The first end is in contact with the first bonding pad of the first semiconductor chip, and the second end is in contact with the first connection pad of the package substrate.

In one or more embodiments of the present disclosure, the first end of the first wire is in contact with the first end of the second wire.

In one or more embodiments of the present disclosure, the second end of the first wire is spaced apart from the second end of the second wire.

In one or more embodiments of the present disclosure, the semiconductor package further includes a second semiconductor chip disposed over the first semiconductor chip. The first bonding wires extend into a gap between the first semiconductor chip and the second semiconductor chip.

In one or more embodiments of the present disclosure, the second semiconductor chip includes a chip pad, a bonding pad, and a redistribution layer. The redistribution layer of the second semiconductor chip is connected between the chip pad of the second semiconductor chip and the bonding pad of the second semiconductor chip. The semiconductor package further includes a plurality of second bonding wires connected in parallel between a second connection pad of the package substrate and the bonding pad of the second semiconductor chip. The chip pad of the second semiconductor chip is a power pad or a ground pad.

In accordance with some embodiments of the present disclosure, a method of manufacturing a semiconductor device includes: providing a package substrate with a first connection pad; providing a semiconductor chip over the package substrate, the semiconductor chip includes a first chip pad, a first bonding pad, and a first redistribution layer, wherein the first bonding pad is closer to a periphery of the semiconductor chip than the first chip pad, and the first redistribution layer is connected between the first chip pad and the first bonding pad; and forming a plurality of first bonding wires connected in parallel between the first connection pad of the package substrate and the first bonding pad of the semiconductor chip.

In one or more embodiments of the present disclosure, the first chip pad is a power pad or a ground pad through which power is supplied to the semiconductor chip.

In one or more embodiments of the present disclosure, the semiconductor chip further includes a second chip pad, a second bonding pad, and a second redistribution layer connected between the second chip pad and the second bonding pad. The second chip pad is a data signal pad or a command/address signal pad. The method further includes: connecting the second bonding pad to a second connection pad of the package substrate with a second bonding wire. The second bonding wire is the only conductive path between the second connection pad and the second bonding pad.

In one or more embodiments of the present disclosure, one or more of the first bonding wires have a cross-sectional area greater than a cross-sectional area of the second bonding wire.

In one or more embodiments of the present disclosure, the step of forming the first bonding wires includes: pulling a first wire from the first connection pad of the package substrate to the first bonding pad of the semiconductor chip; and pulling a second wire from a location where the first wire is attached to the first bonding pad to the first connection pad of the package substrate.

In the semiconductor package of the present disclosure, the bonding pad of the semiconductor chip is connected to the connection pad of the package substrate via multiple bonding wires in parallel. By this arrangement, the effect of inductive reactance of the wirings, including the redistribution layer and the bonding wires, can be minimized.

It is to be understood that both the foregoing general description and the following detailed description are by examples, and are intended to provide further explanation of the invention as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
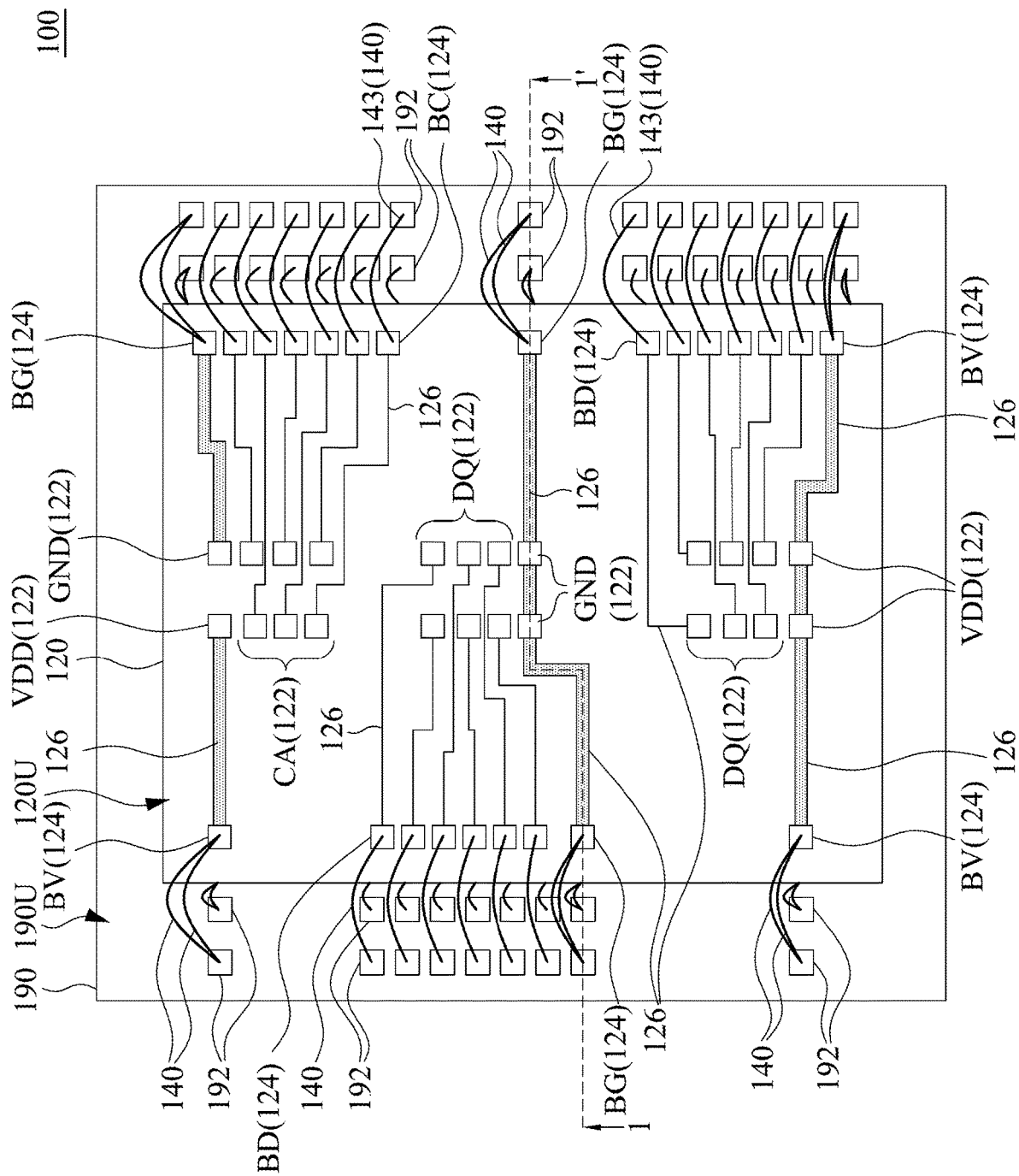
FIG. 1 illustrates a schematic top view of a semiconductor package in accordance with some embodiments of the present disclosure.

Reference will now be made in detail to the present embodiments of the present disclosure, examples of which are illustrated in the accompanying drawings. Wherever possible, the same reference numerals are used in the drawings and the description to refer to the same or like parts.

Figure 2:
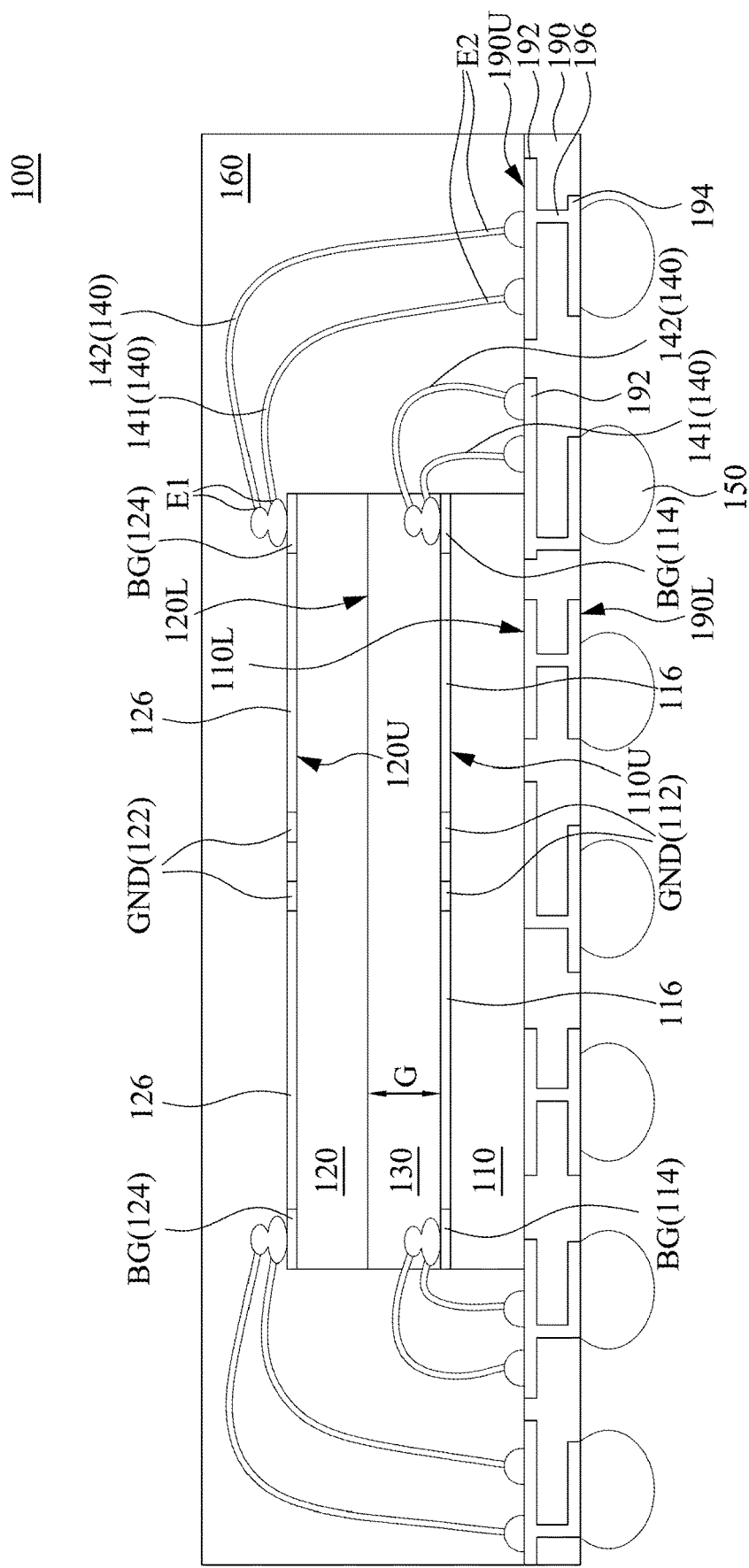
FIG. 2 illustrates a schematic cross-sectional view of the semiconductor package shown in FIG. 1 taken along the reference line 1-1'.

Reference is made to FIGS. 1 and 2. FIG. 1 illustrates a schematic top view of a semiconductor package 100 in accordance with some embodiments of the present disclosure. FIG. 2 illustrates a schematic cross-sectional view of the semiconductor package 100 shown in FIG. 1 taken along the reference line 1-1'. The semiconductor package 100 includes a package substrate 190 and one or more semiconductor chips stacked on the package substrate 190. In the illustrated embodiment, the semiconductor package 100 includes a first semiconductor chip 110 and a second semiconductor chip 120. The first semiconductor chip 110 is disposed over the package substrate 190. The second semiconductor chip 120 is disposed over the first semiconductor chip 110 and keeps a gap G to the first semiconductor chip 110.

In some embodiments, the semiconductor package 100 is a memory package, and the first semiconductor chip 110 and the second semiconductor chip 120 include DRAM dies. In some embodiments, the package substrate 190 is a copper clad laminate (CCL) substrate.

As shown in FIGS. 1 and 2, in some embodiments, the semiconductor package 100 further includes an adhesive layer 130 disposed between the first semiconductor chip 110 and the second semiconductor chip 120. The second semiconductor chip 120 is attached to the first semiconductor chip 110 through the adhesive layer 130. In some embodiments, the semiconductor package 100 may include another adhesive layer (not depicted) through which the first semiconductor chip 110 is attached to the package substrate 190.

As shown in FIGS. 1 and 2, the second semiconductor chip 120 has a lower surface 120L and an upper surface 120U opposite to the lower surface 120L. The lower surface 120L faces the first semiconductor chip 110, and the upper surface 120U is away from the first semiconductor chip 110. The second semiconductor chip 120 includes multiple sets of chip pad 122, bonding pad 124, and redistribution layer 126. The chip pad 122, the bonding pad 124, and the redistribution layer 126 are disposed on the upper surface 120U of the second semiconductor chip 120 (i.e., the upper surface 120U is an active surface of the second semiconductor chip 120, and the second semiconductor chip 120 is said to be "facing up").

As shown in FIGS. 1 and 2, the chip pad 122 is positioned near the center of the upper surface 120U, whereas the bonding pad 124 is positioned near an edge of the upper surface 120U. In other words, the bonding pad 124 is closer to a periphery of the second semiconductor chip 120 than the chip pad 122. The redistribution layer 126 is connected between the chip pad 122 and the bonding pad 124. Specifically, the redistribution layer 126 has two opposite ends that are in contact with the chip pad 122 and the bonding pad 124 respectively. The chip pad 122 and the bonding pad 124 are electrically connected to each other through the redistribution layer 126.

As shown in FIGS. 1 and 2, the first semiconductor chip 110 has a lower surface 110L and an upper surface 110U opposite to the lower surface 110L. The lower surface 110L faces the package substrate 190, and the upper surface 110U is away from the package substrate 190. The first semiconductor chip 110 includes multiple sets of chip pad 112, bonding pad 114 and redistribution layer 116. The chip pad 112, the bonding pad 114 and the redistribution layer 116 are disposed on the upper surface 110U of the first semiconductor chip 110 (i.e., the upper surface 110U is an active surface of the first semiconductor chip 110, and the first semiconductor chip 110 is said to be "facing up").

As shown in FIGS. 1 and 2, the chip pad 112 is positioned close to the center of the upper surface 110U, whereas the bonding pad 114 is positioned close to an edge of the upper surface 110U. In other words, the bonding pad 114 is closer to a periphery of the first semiconductor chip 110 than the chip pad 112. The redistribution layer 116 is connected between the chip pad 112 and the bonding pad 114. Specifically, the redistribution layer 116 has two opposite ends that are in contact with the chip pad 112 and the bonding pad 114 respectively. The chip pad 112 and the bonding pad 114 are electrically connected to each other through the redistribution layer 116.

As shown in FIGS. 1 and 2, in some embodiments, the chip pads 122 of the second semiconductor chip 120 are arranged in one or more columns near the center of the upper surface 120U. In some embodiments, the bonding pads 124 of the second semiconductor chip 120 are arranged in one or more columns near the edge of the upper surface 120U. Likewise, the chip pads 112 of the first semiconductor chip 110 may be arranged in one or more columns near the center of the upper surface 110U, and the bonding pads 114 of the first semiconductor chip 110 may be arranged in one or more columns near the edge of the upper surface 110U.

As shown in FIGS. 1 and 2, in some embodiments, the chip pads 122 of the second semiconductor chip 120 include one or more power pads VDD and one or more ground pads GND, through which power is supplied to the second semiconductor chip 120, one or more data signal pads DQ for transmitting data signals, and one or more command/address signal pads CA for transmitting command/address signals.

As shown in FIGS. 1 and 2, in some embodiments, the bonding pads 124 of the second semiconductor chip 120 include one or more power bonding pads BV, one or more ground bonding pads BG, one or more data bonding pads BD and one or more command/address bonding pads BC. Each of the power bonding pads BV is electrically connected to one of the power pads VDD via the redistribution layer 126, each of the ground bonding pads BG is electrically connected to one of the ground pads GND via the redistribution layer 126, each of the data bonding pads BD is electrically connected to one of the data signal pads DQ via the redistribution layer 126, and each of the command/address bonding pads BC is electrically connected to one of the command/address signal pads CA via the redistribution layer 126.

Likewise, the chip pads 112 of the first semiconductor chip 110 may include one or more power pads VDD, one or more ground pads GND, one or more data signal pads DQ and one or more command/address signal pads CA, and the bonding pads 114 of the first semiconductor chip 110 may include one or more power bonding pads BV, one or more ground bonding pads BG, one or more data bonding pads BD and one or more command/address bonding pads BC. The power pads VDD, the ground pads GND, the data signal pads DQ, the command/address signal pads CA, the power bonding pads BV, the ground bonding pads BG, the data bonding pads BD and the command/address bonding pads BC of the first semiconductor chip 110 may be arranged/connected in a way similar, identical, or substantially identical to those of the second semiconductor chip 120.

As shown in FIGS. 1 and 2, the package substrate 190 includes a plurality of upper connection pads 192. The upper connection pads 192 are disposed on an upper surface 190U of the package substrate 190 and are arranged in one or more columns to one side of the first semiconductor chip 110. The semiconductor package 100 further includes a plurality of bonding wires 140. The bonding pads 114 and 124 are each connected to one of the upper connection pads 192 of the package substrate 190 via at least one bonding wire 140. The bonding wires 140 connected to the bonding pads 114 of the first semiconductor chip 110 may extend into the gap G between the first semiconductor chip 110 and the second semiconductor chip 120. In some embodiments, the bonding wires 140 may include gold (Au), silver (Ag), other suitable electrically conductive materials, or any combination thereof.

As shown in FIGS. 1 and 2, at least one of the bonding pads 114 or 124 is connected to the upper connection pad 192 via two or more bonding wires 140 in parallel. In other words, the two or more bonding wires 140 form a parallel circuit between the bonding pad 114 or 124 and the upper connection pad 192. In the illustrated embodiment, the bonding wires 140 include a first wire 141 and a second wire 142. The first wire 141 and the second wire 142 each have a first end E1 and a second end E2. The first end E1 is in contact with the bonding pad 114 or 124, and the second end E2 is in contact with the upper connection pad 192. By connecting two or more bonding wires 140 in parallel between the bonding pad 114/124 and the upper connection pad 192, the effect of inductive reactance of the wirings, including the redistribution layer 116/126 and the bonding wires 140, can be minimized.

As shown in FIGS. 1 and 2, in some embodiments, at least one of the power bonding pads BV or the ground bonding pads BG is connected to one of the upper connection pads 192 via two or more bonding wires 140 in parallel. As mentioned above, such arrangement can minimize the inductive reactance of the wirings. Thus, applying such technique to the power connections, which generally requires larger electric current, can enable stable power delivery to the first semiconductor chip 110 and the second semiconductor chip 120. In some embodiments, each of the power bonding pads BV and the ground bonding pads BG is connected to one of the upper connection pads 192 via two or more bonding wires 140 in parallel.

As shown in FIGS. 1 and 2, in some embodiments, at least one of the data signal pads DQ or the command/address signal pads CA may be electrically connected to the package substrate 190 via exactly one bonding wire 140, since data or command/address signal transmission generally requires smaller electric current. In some embodiments, each of the data signal pads DQ and the command/address signal pads CA is electrically connected to the package substrate 190 via exactly one bonding wire 140.

As shown in FIGS. 1 and 2, in some embodiments, the bonding wires 140 may include a third wire 143. The third wire 143 has a first end and a second end opposite to the first end. The first end of the third wire 143 is in contact with one of the data bonding pads BD or the command/address bonding pads BC, and the second end of the third wire 143 is in contact with one of the upper connection pads 192 of the package substrate 190. The third wire 143 is the only conductive path between the data bonding pad BD or the command/address bonding pad BC and the corresponding upper connection pad 192.

As shown in FIGS. 1 and 2, in some embodiments, one or more of the first wire 141 and the second wire 142 (which are connected to the power bonding pad BV or the ground bonding pad BG) have a cross-sectional area greater than a cross-sectional area of the third wire 143 (which is connected to the data bonding pad BD or the command/address bonding pad BC). For example, one or more of the first wire 141 and the second wire 142 may have a diameter greater than a diameter of the third wire 143. By this arrangement, the effect of inductive reactance of the power wirings can be further reduced.

In some embodiments, a cross-sectional area of the redistribution layer 116/126 connected to the power bonding pad BV or the ground bonding pad BG is greater than a cross-sectional area of the redistribution layer 116/126 connected to the data bonding pad BD or the command/address bonding pad BC. In some embodiments, a width of the redistribution layer 116/126 connected to the power bonding pad BV or the ground bonding pad BG is greater than a width of the redistribution layer 116/126 connected to the data bonding pad BD or the command/address bonding pad BC.

As shown in FIGS. 1 and 2, in some embodiments, the first end E1 of the first wire 141 is in contact with the first end E1 of the second wire 142. In some embodiments, the second end E2 of the first wire 141 is spaced apart from the second end E2 of the second wire 142. In some embodiments, the first wire 141 and the second wire 142 can be formed by pulling the first wire 141 from the upper connection pad 192 to the bonding pad 114/124, and subsequently pulling the second wire 142 from a location where the first wire 141 is attached to the bonding pad 114/124 to the upper connection pad 192.

As shown in FIGS. 1 and 2, in some embodiments, the package substrate 190 further includes a plurality of lower connection pads 194 and a plurality of internal wirings 196. The lower connection pads 194 are disposed on a lower surface 190L of the package substrate 190. The internal wirings 196 extend through the package substrate 190 and are connected between the upper connection pads 192 and the lower connection pads 194. In some embodiments, the internal wirings 196 may include conductive traces, conductive vias, or combinations thereof.

As shown in FIGS. 1 and 2, in some embodiments, the semiconductor package 100 further includes a plurality of external connection terminals 150 disposed below the package substrate 190. Each of the external connection terminals 150 is disposed on and in contact with one of the lower connection pads 194. In some embodiments, the external connection terminals 150 may include solder balls, solder bumps, or combinations thereof.

As shown in FIGS. 1 and 2, in some embodiments, the semiconductor package 100 further includes a molding compound 160. The molding compound 160 is disposed over the package substrate 190 and encapsulates the first semiconductor chip 110, the second semiconductor chip 120 and the bonding wires 140. Specifically, the molding compound 160 covers the upper surface 120U of the second semiconductor chip 120, the side surfaces of the first and second semiconductor chips 110 and 120, and the upper surface 190U of the package substrate 190.

Next, a method of manufacturing the semiconductor package 100 will be described with reference to FIGS. 1 and 2.

The method of manufacturing the semiconductor package 100 commences at step S1, which includes: providing the package substrate 190, the package substrate 190 including the upper connection pads 192.

Next, the method of manufacturing the semiconductor package 100 continues to step S3, which includes: providing the first semiconductor chip 110 over the package substrate 190, the first semiconductor chip 110 including the chip pad 112, the bonding pad 114 and the redistribution layer 116, the redistribution layer 116 being connected between the chip pad 112 and the bonding pad 114.

In some embodiments, step S3 includes: attaching the first semiconductor chip 110 to the upper surface 190U of the package substrate 190 with an adhesive layer (not depicted).

Next, the method of manufacturing the semiconductor package 100 continues to step S5, which includes: forming a plurality of bonding wires 140 connected in parallel between one of the upper connection pads 192 of the package substrate 190 and the bonding pad 114 of the first semiconductor chip 110. In some embodiments, the bonding wires 140 are formed by means of ball bonding.

In some embodiments, step S5 includes: pulling the first wire 141 from the upper connection pad 192 of the package substrate 190 to the bonding pad 114, followed by pulling the second wire 142 from a location where the first wire 141 is attached to the bonding pad 114 to the upper connection pad 192. In some embodiments, the chip pad 112 coupled to the first wire 141 and the second wire 142 is a power pad VDD or a ground pad GND.

In some embodiments, the method further includes: connecting the data bonding pad BD or the command/address bonding pad BC of the first semiconductor chip 110 to one of the upper connection pads 192 of the package substrate 190 with the third wire 143.

In some embodiments, the method further includes: providing the second semiconductor chip 120 over the first semiconductor chip 110 (e.g., by attaching the second semiconductor chip 120 to the upper surface 110U of the first semiconductor chip 110 with the adhesive layer 130); and forming a plurality of bonding wires 140 connected in parallel between one of the upper connection pads 192 of the package substrate 190 and the bonding pad 124 of the second semiconductor chip 120. In some embodiments, the method further includes: providing the molding compound 160 over the package substrate 190 to encapsulate the first semiconductor chip 110, the second semiconductor chip 120 and the bonding wires 140.

In the semiconductor package of the present disclosure, the bonding pad of the semiconductor chip is connected to the connection pad of the package substrate via multiple bonding wires in parallel. By this arrangement, the effect of inductive reactance of the wirings, including the redistribution layer and the bonding wires, can be minimized.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims.

What is claimed is:

1. A semiconductor package, comprising:
  a package substrate comprising a first connection pad and a second connection pad;
  a first semiconductor chip disposed over the package substrate, the first semiconductor chip comprising a first chip pad, a first bonding pad, and a first redistribution layer, wherein the first bonding pad is closer to a periphery of the first semiconductor chip than the first chip pad, and the first redistribution layer is connected between the first chip pad and the first bonding pad, wherein the first chip pad is a power pad or a ground pad through which power is supplied to the first semiconductor chip; and
  a plurality of first bonding wires connected in parallel between the first connection pad and the first bonding pad;
  wherein the first semiconductor chip further comprises a second chip pad electrically connected to the package substrate through a second bonding wire, and the second chip pad is a data signal pad or a command/address signal pad, wherein the first semiconductor chip further comprises a second bonding pad and a second redistribution layer, the second redistribution layer is connected between the second chip pad and the second bonding pad, wherein the second bonding wire is connected between the second connection pad and the second bonding pad, and the second bonding wire is the only conductive path between the second connection pad and the second bonding pad.

2. The semiconductor package of claim 1, wherein one or more of the first bonding wires have a cross-sectional area greater than a cross-sectional area of the second bonding wire.

3. The semiconductor package of claim 1, wherein the first bonding wires comprise a first wire and a second wire each having a first end and a second end, wherein the first end is in contact with the first bonding pad of the first semiconductor chip, and the second end is in contact with the first connection pad of the package substrate.

4. The semiconductor package of claim 3, wherein the first end of the first wire is in contact with the first end of the second wire.

5. The semiconductor package of claim 3, wherein the second end of the first wire is spaced apart from the second end of the second wire.

6. The semiconductor package of claim 1, further comprising a second semiconductor chip disposed over the first semiconductor chip, wherein the first bonding wires extend into a gap between the first semiconductor chip and the second semiconductor chip.

7. The semiconductor package of claim 6, wherein the second semiconductor chip comprises a chip pad, a bonding pad, and a redistribution layer, the redistribution layer of the second semiconductor chip is connected between the chip pad of the second semiconductor chip and the bonding pad of the second semiconductor chip, wherein the semiconductor package further comprises a plurality of third bonding wires connected in parallel between a third connection pad of the package substrate and the bonding pad of the second semiconductor chip, wherein the chip pad of the second semiconductor chip is a power pad or a ground pad.

8. A method of manufacturing a semiconductor package, comprising:

providing a package substrate with a first connection pad and a second connection pad;

providing a semiconductor chip over the package substrate, the semiconductor chip comprising a first chip pad, a first bonding pad, and a first redistribution layer, wherein the first bonding pad is closer to a periphery of the semiconductor chip than the first chip pad, and the first redistribution layer is connected between the first chip pad and the first bonding pad, wherein the first chip pad is a power pad or a ground pad through which power is supplied to the semiconductor chip, wherein the semiconductor chip further comprises a second chip pad, a second bonding pad, and a second redistribution layer connected between the second chip pad and the second bonding pad, the second chip pad is a data signal pad or a command/address signal pad;

forming a plurality of first bonding wires connected in parallel between the first connection pad of the package substrate and the first bonding pad of the semiconductor chip; and connecting the second bonding pad to the second connection pad of the package substrate with a second bonding wire, wherein the second bonding wire is the only conductive path between the second connection pad and the second bonding pad.

9. The method of claim 8, wherein one or more of the first bonding wires have a cross-sectional area greater than a cross-sectional area of the second bonding wire.

10. The method of claim 8, wherein the forming the plurality of first bonding wires comprises:

pulling a first wire from the first connection pad of the package substrate to the first bonding pad of the semiconductor chip; and pulling a second wire from a location where the first wire is attached to the first bonding pad to the first connection pad of the package substrate.

\* \* \* \* \*